(12) United States Patent
Monnig et al.

(10) Patent No.: US 11,606,886 B2
(45) Date of Patent: *Mar. 14, 2023

(54) MEASUREMENT OF DIELECTRIC LIQUID LEVEL CHANGE IN SINGLE PHASE OR TWO-PHASE IMMERSION COOLING SYSTEMS

(71) Applicant: TMGCore, INC., Plano, TX (US)

(72) Inventors: Taylor Monnig, Plano, TX (US);
Edward King, Plano, TX (US);
Mazyar Amin, Plano, TX (US);
Thomas Turner, Plano, TX (US)

(73) Assignee: TMGCore, Inc., Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/685,990

(22) Filed: Mar. 3, 2022

(65) Prior Publication Data
US 2022/0390266 A1 Dec. 8, 2022

Related U.S. Application Data

(63) Continuation-in-part of application No. 17/336,908, filed on Jun. 2, 2021, now Pat. No. 11,304,342.

(51) Int. Cl.
| | |
|---|---|
| *H05K 7/20* | (2006.01) |
| *G01F 23/60* | (2006.01) |
| *G01F 23/36* | (2006.01) |
| *G01F 23/00* | (2022.01) |
| *G01F 23/56* | (2006.01) |

(52) U.S. Cl.
CPC ......... *H05K 7/208* (2013.01); *G01F 23/0038* (2013.01); *G01F 23/36* (2013.01); *G01F 23/363* (2013.01); *G01F 23/56* (2013.01); *G01F 23/60* (2013.01); *G01F 23/603* (2013.01); *H05K 7/20236* (2013.01); *H05K 7/20263* (2013.01); *H05K 7/20272* (2013.01); *H05K 7/20763* (2013.01); *H05K 7/20781* (2013.01)

(58) Field of Classification Search
CPC ...... G01F 23/60; G01F 23/603; G01F 23/336; G01F 23/363; G01F 23/0038; H01K 7/208; H05K 7/208
See application file for complete search history.

(56) References Cited

U.S. PATENT DOCUMENTS

| | | | | |
|---|---|---|---|---|
| 3,754,446 | A | * | 8/1973 | O'Connor ................ G01N 9/18 73/309 |
| 6,026,683 | A | * | 2/2000 | Lee ..................... G01F 23/0038 73/309 |

(Continued)

FOREIGN PATENT DOCUMENTS

CN      201746123 U   *   2/2011

*Primary Examiner* — Paul M. West
(74) *Attorney, Agent, or Firm* — Hunton Andrews Kurth LLP (57) ABSTRACT

The instant application pertains to new liquid level monitoring apparatus and a cooling system for computer components that employs the liquid level monitoring apparatus. In one embodiment, the liquid level measurement device comprises a load cell and a buoyancy element. The buoyancy element is configured to be partially submerged in a dielectric liquid. The load cell and the buoyancy element are operably connected such that a change in liquid volume may be determined using Archimedes' principle.

9 Claims, 7 Drawing Sheets

(56) References Cited

U.S. PATENT DOCUMENTS

| | | | |
|---|---|---|---|
| 6,029,514 A * | 2/2000 | Adam | G01F 23/0038 |
| | | | 73/309 |
| 10,925,188 B1 * | 2/2021 | Keehn | H05K 7/20754 |
| 2002/0029633 A1 * | 3/2002 | Yekutiely | G01F 23/0023 |
| | | | 73/309 |

* cited by examiner

MEASUREMENT OF DIELECTRIC LIQUID LEVEL CHANGE IN SINGLE PHASE OR TWO-PHASE IMMERSION COOLING SYSTEMS

CROSS-REFERENCE TO RELATED APPLICATIONS

This application is a continuation-in-part of U.S. Ser. No. 17/336,908 filed Jun. 2, 2021 and allowed on Jan. 26, 2022. The application is also related to PCT publication WO2020/102090 filed Nov. 11, 2019 titled "Liquid Immersion Cooling Platform" owned by TMGCore, LLC which application is incorporated herein by reference.

FIELD OF THE DISCLOSURE

The present disclosure relates to, for example, liquid immersion cooling systems with a liquid level measurement and monitoring device.

BACKGROUND AND SUMMARY

Halocarbons such as perfluorocarbon liquid dielectric fluids such as NOVEC™ are frequently employed in two phase immersion cooling of computer components such as servers while oils such as mineral oil are often used in single phase immersion cooling. The fluid may be lost for various reasons such as when servers are swapped or due to leaks in the system. The loss of even small amounts of fluid can be both expensive and deleterious to the system. Many common level sensors such as optical or ultrasonic types may not be particularly effective when used with fluorocarbon liquids. Accordingly, what is needed are new methods and systems for measuring the liquid level that are precise, efficient and/or effective.

Advantageously, the instant application pertains to new liquid level monitoring apparatus, methods, and systems. In one embodiment, the application pertains to a liquid level measurement device comprising a load cell and a buoyancy element. The buoyancy element is configured to be partially submerged in the liquid phase. The load cell and the buoyancy element are operably connected such that a change in liquid level may be determined using (1) the change in force measured by the load cell, (2) the density of the buoyancy element, (3) the cross-sectional area of the buoyancy element, (4) the density of the liquid, and (5) the movement of the buoyancy element due to the change in force on the load cell. That is, Archimedes' principle is employed.

In another embodiment the liquid level measurement device is employed in an immersion cooling system for computing components. In addition to the measurement device, the system comprises a vessel configured to contain a dielectric fluid in both liquid and vapor phases. A rack is configured to hold one or more computer components such that one or more computer components are at least partially submerged within the liquid phase of the volume of thermally conductive, boilable, and condensable dielectric fluid. A condenser is configured for actively condensing a dielectric fluid from vapor phase to liquid phase.

These and other objects, features and advantages of the exemplary embodiments of the present disclosure will become apparent upon reading the following detailed description of the exemplary embodiments of the present disclosure, when taken in conjunction with the appended claims.

BRIEF DESCRIPTION OF THE DRAWINGS

Various embodiments of the present disclosure, together with further objects and advantages, may best be understood by reference to the following description taken in conjunction with the accompanying drawings.

DETAILED DESCRIPTION

The following description of embodiments provides non-limiting representative examples to particularly describe features and teachings of different aspects of the invention. The embodiments described should be recognized as capable of implementation separately, or in combination, with other embodiments from the description of the embodiments. A person of ordinary skill in the art reviewing the description of embodiments should be able to learn and understand the different described aspects of the invention. The description of embodiments should facilitate understanding of the invention to such an extent that other implementations, not specifically covered but within the knowledge of a person of skill in the art having read the description of embodiments, would be understood to be consistent with an application of the invention.

In one embodiment the present application pertains to a liquid level measurement device. While described herein as a component in an immersion cooling system for dielectric fluid, the liquid level measurement device may be employed in virtually any compatible environment with virtually any liquid wherein precision, accuracy, or both are required. That is, an ordinarily skilled artisan would use the instant disclosure to modify materials and/or components of the liquid level measurement device to employ it in chemical reactors, water treatment facilities, or any other industrial, commercial, or in certain situations even household vessel where it is desired to monitor fluid level.

The liquid level measurement device typically comprises a load cell and a buoyancy element. The type, capacity, size, and material of the load cell may vary depending upon the application, the density and mass of the buoyancy element, density of the liquid, rate of liquid level change, magnitude of electrical and mechanical noises in the installation environment, compatibility of the fluid vapor with the various components of the load cell and/or other parameters. As used herein "load cell" is any sensor for measuring force. Typical load cells that may be employed may include those that are mechanical, pneumatic, hydraulic, electric, or any combination of these. The load cell may detect weight in any convenient manner such as using shear, bending, compression, or tension. Particularly useful load cells include strain gauges with high precision.

A buoyancy element is employed which is usually configured to be partially submerged in the liquid. Generally, the load cell and the buoyancy element are operably connected such that a change in liquid level may be determined using (1) the change in force measured by the load cell, (2) the density of the buoyancy element, (3) the cross-sectional area of the buoyancy element, (4) the density of the liquid, and (5) the movement of the buoyancy element due to the change in force on the load cell.

The size, shape, and material of the buoyancy element may differ depending upon the properties of fluid being measured (such as density, surface tension, compatibility of fluid with the element), the vessel geometry, environment conditions, mechanical noise level, magnitude of expected level change, ability to shed fluid from its surfaces, and the level measurement precision required. Materials such as metals, alloys, vitreous materials, various plastics, or combinations thereof may be employed as the buoyancy element.

The load cell and the buoyancy element may be operably connected in any convenient manner so long as a change in level of the liquid may be determined. Useful configurations vary depending upon the specific buoyancy element and the load cell employed. Generally, in one embodiment the buoyancy element is configured to hang substantially vertically from the load cell such that the buoyancy element is partially submerged in the liquid phase. The material for hanging may be any material that sufficiently holds the buoyancy element in the desired position and is compatible with the desired testing environment. Thus, in some embodiments the material may be somewhat flexible such a wire or string-like material.

In some embodiments it may be desirable to employ an actuator, a motor such as a variable speed motor, or both. If employed either or both which may be configured to facilitate raising and/or lowering the buoyancy element. In this manner the amount of submersion of the buoyancy element in the liquid may be precisely and/or accurately controlled so that the buoyancy element may be positioned to optimize anticipated level changes, which in turn leads to more precise and/or accurate measurements of changes in level.

In some embodiments machinable metals like aluminum may be employed to obtain a precise cross-sectional shape. Thus, in some embodiments a cylindrical or disk shaped buoyancy element may be employed that is comprised of a metal such as aluminum. The size may vary and an aspect ratio may be selected that corresponds to a desired sensitivity and may be selected based upon a given designer's configuration. In some embodiments, a disc shaped buoyancy element may have a diameter of from about 2, or from about 3, or from about 3.5 inches up to about 6, or up to about 5, or up to about 2.5 inches. In some embodiments, a disc shaped buoyancy element may have a height of from about 0.5, or from about 0.75, up to about 1.5, or up to about 1 inch.

In some embodiments the liquid may be subject to some turbulence, motion, or other forces which could tend to disturb the measurements of the liquid level measurement device. In such cases it may be desirable to include a disturbance reducer. The form of such a disturbance reducer may vary depending upon the system and liquid being measured. In one embodiment a housing which at least partially surrounds the buoyancy element only, or the load cell and buoyancy element, may be employed. Such a housing is configured to reduce disturbances by reducing or eliminating interfering liquid movements other than gradual rising or falling of the liquid level at or near the buoyancy element. The housing may include features, such as one or more holes or slots, to allow free ingress and egress of liquid, to maintain the liquid level inside the housing equal to the level outside the housing.

A processor may be employed and operably connected to the liquid level measurement device if desired. Among other items, the processor may be configured to receive the force on the load cell and calculate the change in liquid level using other known parameters such as the density of the buoyancy element, the cross-sectional area of the buoyancy element, and the density of the liquid. If desired, the processor may be configured to institute certain changes to the system based on the change in liquid level. The processor may also be operably connected to other sensors such as a leak detector or fluid detector such that a variety of data may be processed and actions initiated, changed, or stopped. For example, depending upon the change in liquid level measured, the processor may send a signal to add or remove liquid.

As described above, the liquid level measurement device may be used in many different systems but is described herein as particularly applicable to a single phase or two-phase immersion cooling system for computing components. The two-phase immersion system may comprise a vessel configured to comprise a volume of thermally conductive, boilable and condensable dielectric fluid in a liquid phase and a vapor phase. A single phase immersion system may comprise a vessel configured to comprise a volume of thermally conductive dielectric fluid, e.g., mineral oil, in a liquid phase. In either single phase or two phase systems, a rack may be configured to hold one or more computer components such that the one or more computer components may be at least partially submerged within the liquid of the dielectric fluid. In two-phase systems a condenser for actively condensing a vapor phase dielectric fluid to a liquid phase dielectric fluid is generally employed while in single phase systems a heat exchanger may be employed. The above-described liquid level measurement device may then be employed to determine a change in dielectric liquid volume. If desired, the system may include a tank configured to comprise a volume of the desired single phase or two-phase dielectric fluid that is separate from the vessel and contained within or exterior to the vessel. In this manner the system may be configured (1) to transfer dielectric fluid from the tank to the vessel; or (2) to transfer dielectric fluid from the vessel to the tank; or (3) both (1) and (2) based on the determined change in liquid volume.

The liquid level measurement device described above may be located at any convenient location within the vessel or the tank so long as changes in liquid level may be measured, and changes in liquid volume may be determined. The location may vary depending upon the system's configuration and its components. In one embodiment, the vessel comprises a bath area wherein the computer components are at least partially submerged. A sump area may be separated from the bath area by a weir such that the bath area maintains a relatively constant level of fluid. Thus, in this configuration the liquid level measurement device is located in the sump area wherein fluid losses would result in a reduction in the liquid level. In some embodiments the location of the device may be selected to ameliorate to at least some extent or a even a great extent an eect of downfall or splash of fluid on the assembly. In this manner noise and/or disturbances may be eliminated or at least diminished.

In another embodiment for single phase immersion the system has two separate tanks for server placement with a center reservoir. Surrounding each tank is a weir channel that forces collection of the fluid to the center reservoir. Fluid collects in the center reservoir and is pumped into a two-sided heat exchanger, one side for fluid and one side for house cooling water. The house water and plate exchanger work together to remove heat from the fluid. From the heat exchanger, the fluid is forced into the bottom of each tank and mixed in an area below the servers and forced to flow from the bottom of each tank to the top of the tank and resultantly into the weir channels. In this configuration the liquid level measurement device may be located in the center reservoir wherein fluid losses would result in a reduction in the liquid level.

Generally, the methods of using the liquid level measurement device in the single phase or two-phase immersion cooling system employ first operating the system at a steady state. The buoyancy element is then positioned such that the desired volume of the buoyancy element is submerged. The position may vary depending upon the buoyancy element shape, overall system design, and anticipated level change, but in some embodiments such as the disk— shaped element described above, at least about 20% and up to about 80% of the volume of the buoyancy element may be submerged. In this manner a change in liquid level may be determined (and any corresponding change in volume of the reservoir calculated based on the reservoir geometry). Adjustments to the system may then be made depending upon a change in liquid volume.

Figure 1:
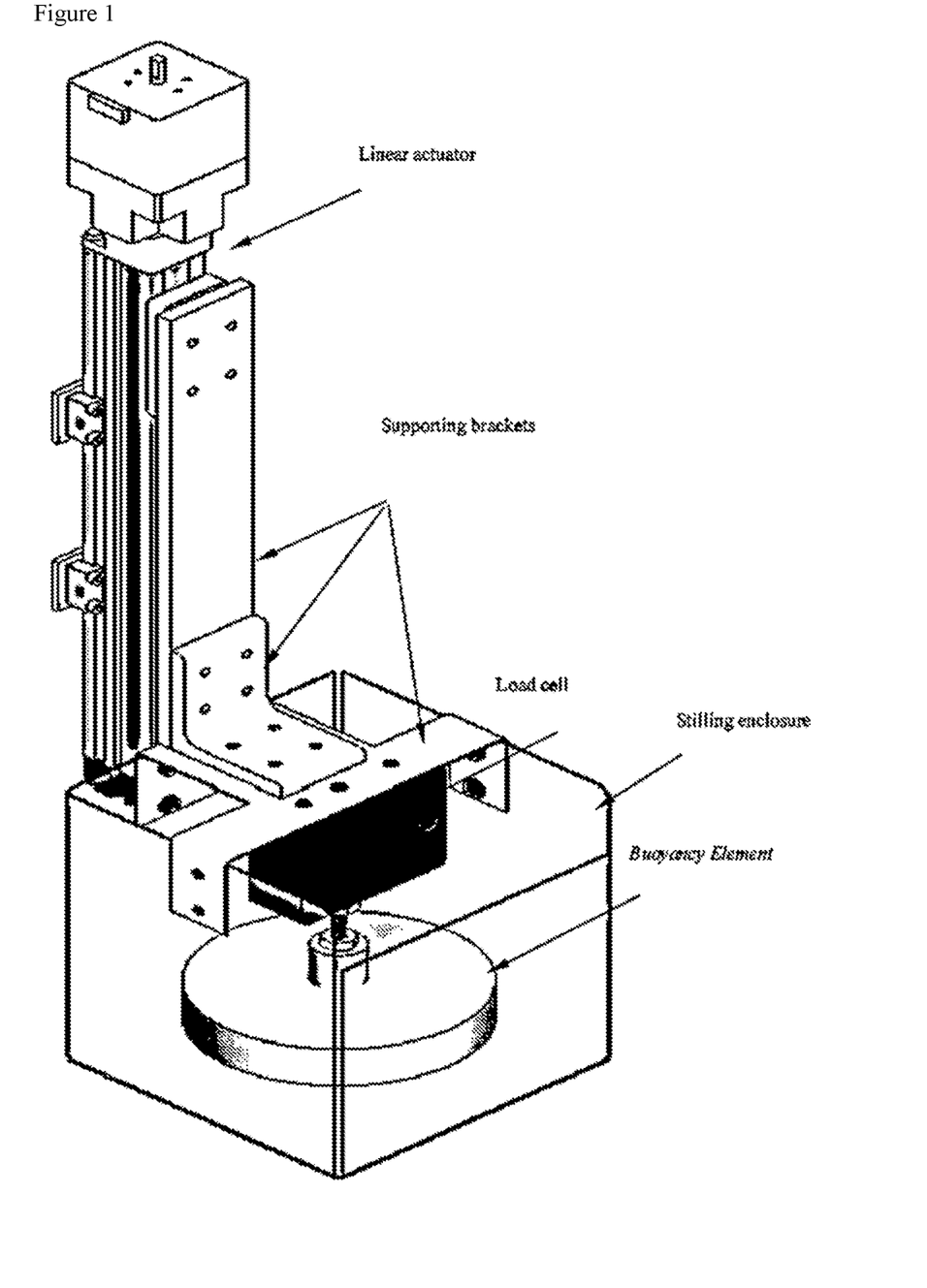
FIG. 1 shows a representative liquid level measurement device.

FIG. 1 shows a representative liquid level measurement device comprising a linear actuator with supporting brackets attached to a load cell which is operably connected to the buoyancy element. A disturbance reducer such as the stilling enclosure depicted is employed to minimize the effect of liquid movements, other than the gradual rise or fall of the liquid level, on the force measurements.

Figure 2:
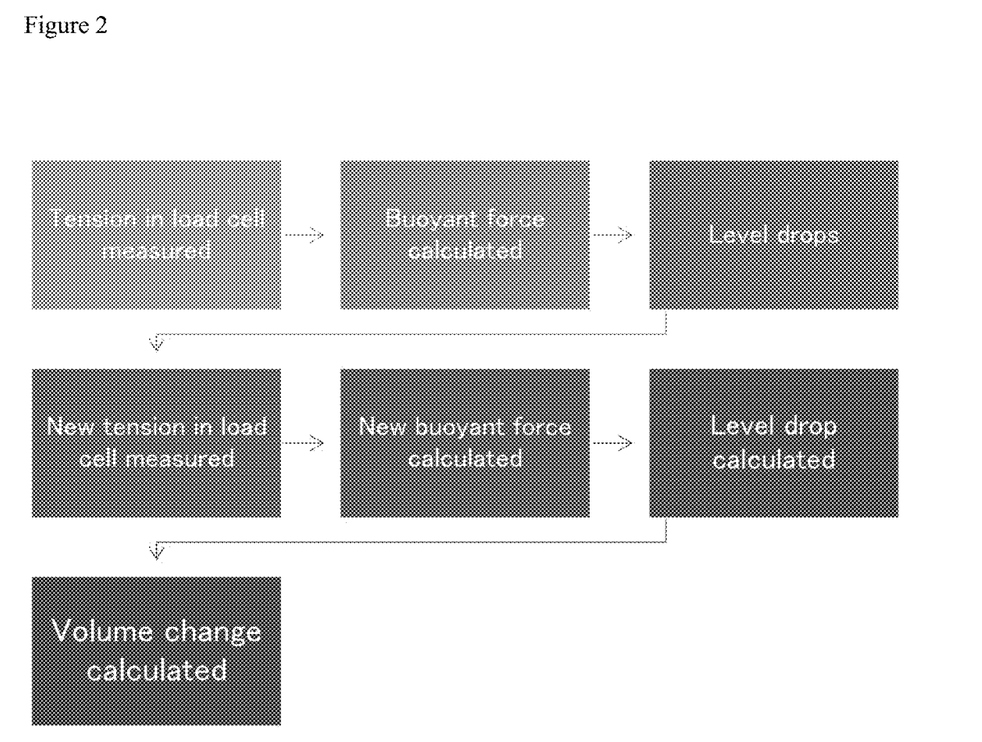
FIG. 2 shows a representative of the overall method of calculating volume change using, for example, a liquid level measurement device of the present application.
Figure 3:
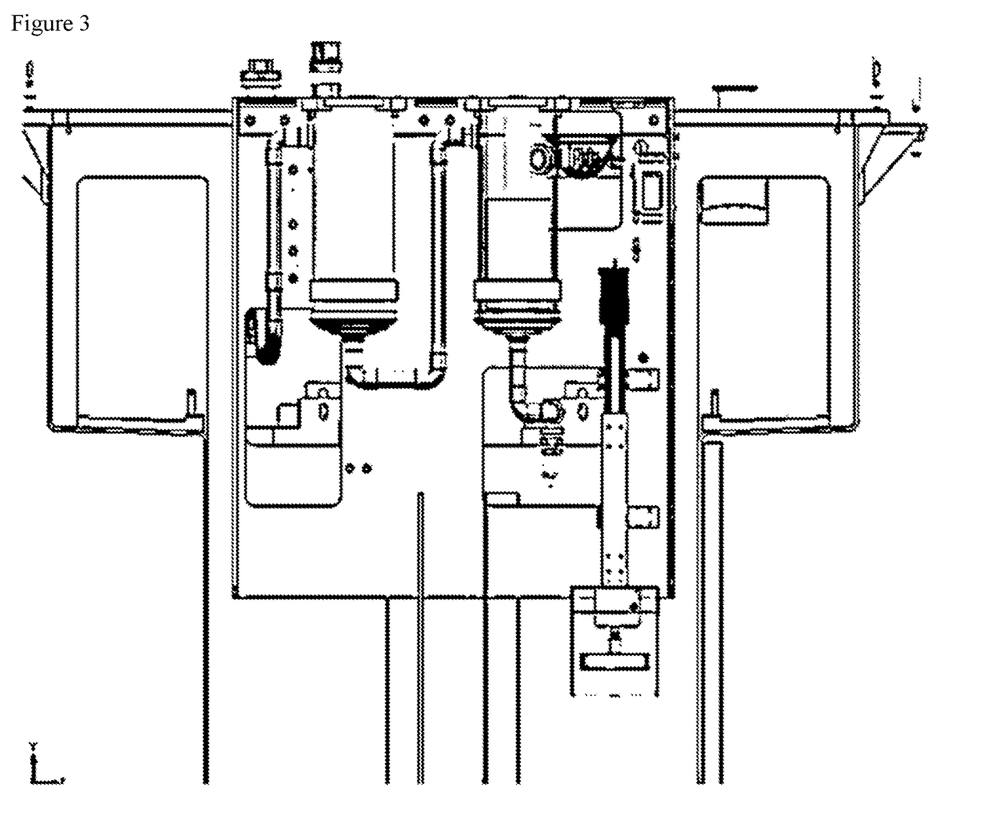
FIG. 3 shows a view of a representative liquid level measurement device located in a sump area of a cooling system vessel.
Figure 4:
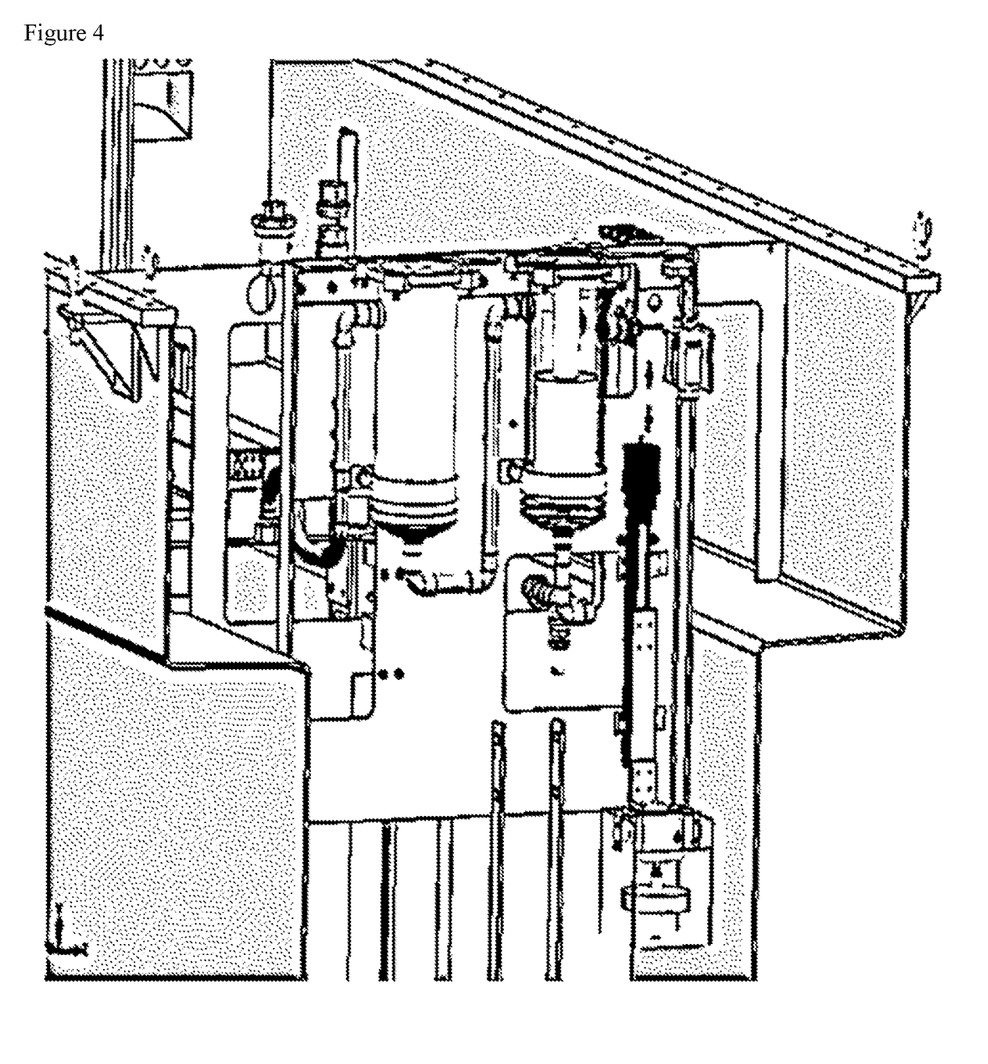
FIG. 4 shows a second view of a representative liquid level measurement device located in a sump area of a cooling system vessel.

FIG. 2 shows a representative method of calculating level (and corresponding volume) change using, for example, a liquid level measurement device such as that shown in FIG. 1. If desired, the method of FIG. 2 can be implemented with a processor connected to the liquid level measurement device. FIGS. 3 and 4 show the liquid level measurement device within a representative two-phase immersion cooling system such as those described above (liquid level not depicted). As shown in FIGS. 3 and 4 the liquid level measurement device is located within a sump area of the vessel in the two-phase immersion cooling system. Such two-phase immersion cooling systems are described in more detail in PCT publication WO2020/102090 filed Nov. 11, 2019 titled "Liquid Immersion Cooling Platform" and in U.S. Patent Publication 20210022263 filed Sep. 14, 2020 titled "ABSORPTION/DESORPTION PROCESSES AND SYSTEMS FOR LIQUID IMMERSION COOLING." Both applications are owned by TMGCore, LLC and are incorporated herein by reference.

Figure 5:
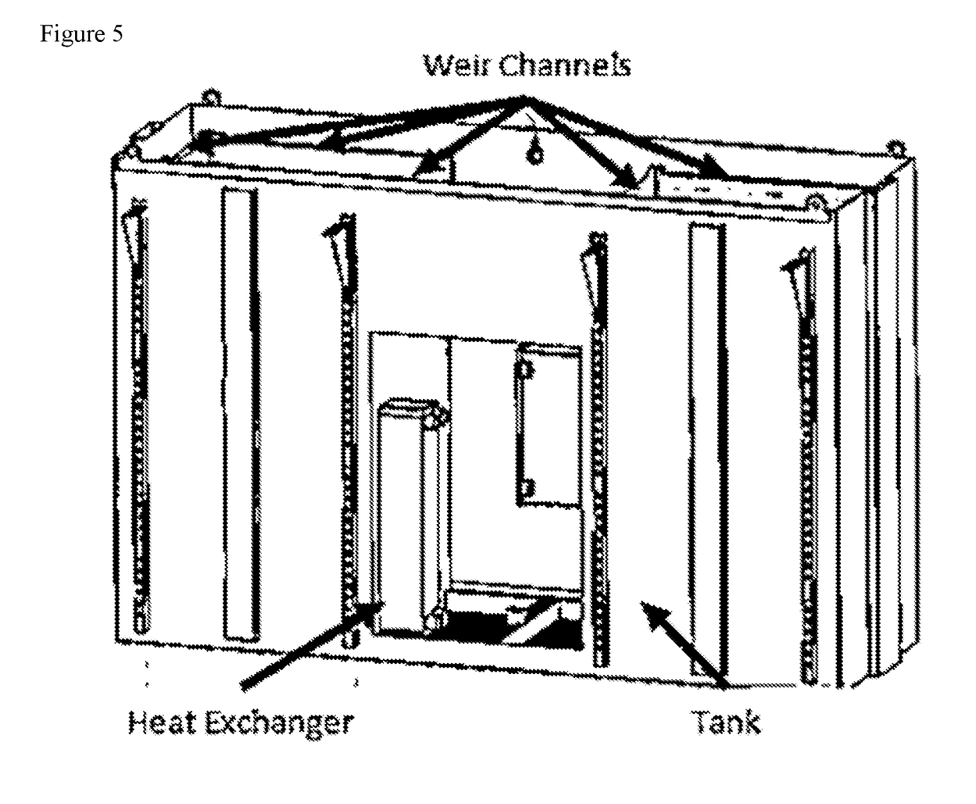
FIG. 5 shows a representative single phase immersion cooling tank in which a liquid level measurement device may be employed in the liquid.
Figure 6:
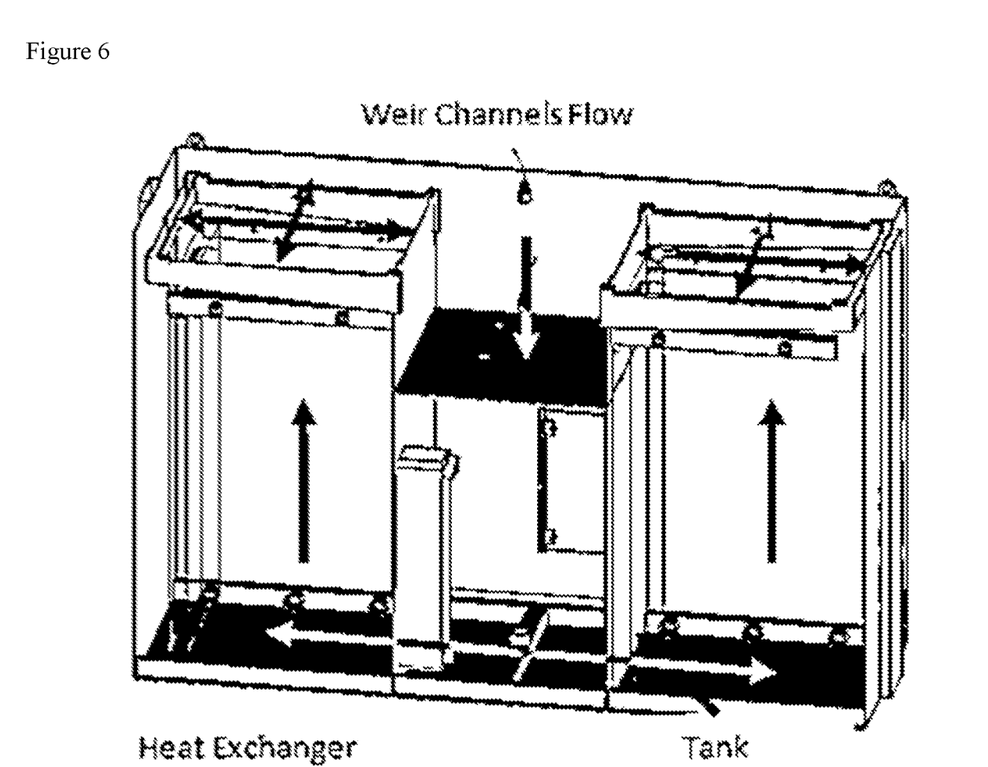
FIG. 6 shows the weir channel fluid flow in a representative single phase immersion cooling tank in which a liquid level measurement device may be employed in the liquid.
Figure 7:
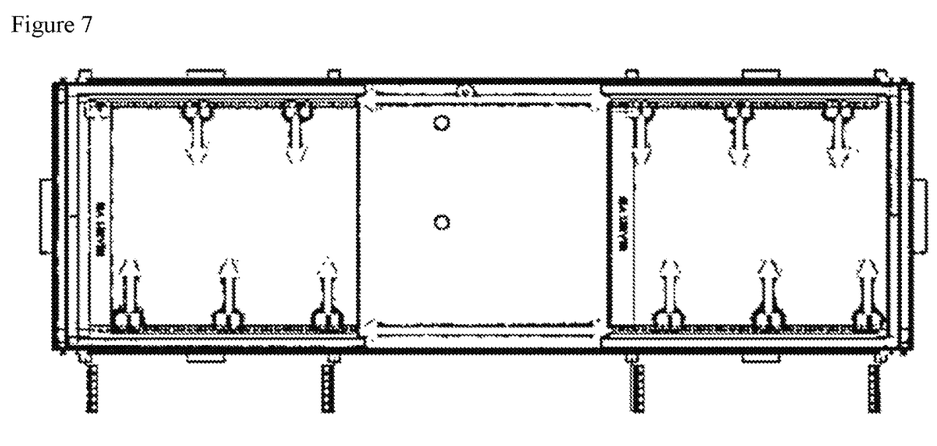
FIG. 7 shows the flow pattern for mixing at the bottom of a representative single phase immersion cooling tank in an area below where the servers are located.

FIGS. 5 and 6 show a representative single phase immersion cooling tank in which a liquid level measurement device may be employed in the liquid. As shown in FIGS. 5-6 there are two separate tanks for server placement with a center reservoir. Surrounding each tank is a weir channel that forces collection of the fluid to the center reservoir. Fluid collects in the center reservoir and is pumped into a two-sided heat exchanger, one side for fluid and one side for house cooling water. The house water and plate exchanger work together to remove heat from the fluid. From the heat exchanger, the fluid is forced into the bottom of each tank and mixed in an area below the servers as shown in FIG. 7. From the area below the servers the fluid is forced to flow from the bottom of each tank to the top of the tank and resultantly into the weir channels. In this configuration the liquid level measurement device may be located in the center reservoir wherein fluid losses could result in a reduction in the liquid level.

Embodiments

1. A cooling system for computing components comprising:
   a vessel configured to comprise a volume of thermally conductive, boilable and condensable dielectric fluid in a liquid phase and a vapor phase;
   a rack configured to hold one or more computer components such that the one or more computer components may be at least partially submerged within the liquid phase of the volume of thermally conductive, boilable and condensable dielectric fluid;
   a condenser for actively condensing a vapor phase dielectric fluid to a liquid phase dielectric fluid; and
   a liquid level measurement device comprising a load cell and a buoyancy element wherein the buoyancy element is configured to be partially submerged in the liquid phase and wherein the load cell and the buoyancy element are operably connected such that a change in liquid level (and/or volume based on geometry) may be determined.
2. The cooling system of embodiment 1 wherein the change in liquid volume is calculated from (1) a change in force measured by the load cell, (2) density of the buoyancy element, (3) cross-sectional area of the buoyancy element, (4) density of the liquid, (5) movement of the buoyancy element due to the change in force on the load cell, and (6) the geometry of the liquid reservoir.
3. The cooling system of embodiment 1 wherein the buoyancy element is configured to hang substantially vertically from the load cell.
4. The cooling system of embodiment 1 further comprising a tank configured to comprise a volume of thermally conductive, condensable dielectric fluid wherein the system is configured (1) to transfer dielectric fluid from the tank to the vessel; or (2) to transfer dielectric fluid from the vessel to the tank; or (3) both (1) and (2) based on a change in liquid level (and/or volume based on geometry).
5. The cooling system of embodiment 1 further comprising an actuator configured to raise and lower the buoyancy element.
6. The cooling system of embodiment 1 further comprising a variable speed motor configured to raise and lower the buoyancy element.
7. The cooling system of embodiment 1 further comprising a housing which at least partially surrounds the load cell and buoyancy element wherein said housing is configured to reduce disturbances.
8. The cooling system of embodiment 1 wherein the vessel comprises a sump area and a bath area and wherein the liquid level measurement device is located in the sump area.
9. A liquid level measurement device comprising:
   a load cell; and
   a buoyancy element;
   wherein the buoyancy element is configured to be partially submerged in a liquid and wherein the load cell and the buoyancy element are operably connected such that a change in liquid level (and/or volume based on geometry) may be determined.

10. The liquid level measurement device of embodiment 9 wherein the change in liquid volume is calculated from (1) a change in force measured by the load cell, (2) density of the buoyancy element, (3) cross-sectional area of the buoyancy element, (4) density of the liquid, (5) movement of the buoyancy element due to the change in force on the load cell, and (6) the geometry of the liquid reservoir.

11. The liquid level measurement device of embodiment 9 wherein the buoyancy element is configured to hang substantially vertically from the load cell.

12. The liquid level measurement device of embodiment 9 further comprising an actuator configured to raise and lower the buoyancy element.

13. The liquid level measurement device of embodiment 9 further comprising a variable speed motor configured to raise and lower the buoyancy element.

14. The liquid level measurement device of embodiment 9 further comprising a housing which at least partially surrounds the load cell and buoyancy element wherein said housing is configured to reduce disturbances.

15. The liquid level measurement device of embodiment 9 wherein the liquid level measurement device is configured to measure an amount of dielectric liquid level change.

16. The liquid level measurement device of embodiment 9 which further comprises a processor configured to receive the change of force in the load cell, and calculate the corresponding change in liquid volume, i.e., the processor may be configured to make a calculation based on reservoir geometry and other fixed specifications to correlate level and volume based on reservoir geometry.

Further Embodiments

1. A cooling system for computing components comprising:
 a vessel configured to comprise a volume of liquid dielectric fluid;
 a central reservoir that is separated from a bath area of the vessel by a wall;
 a rack configured to hold one or more computer components such that the one or more computer components are configured to be:
  at least partially submerged within the liquid dielectric fluid; and
  lifted out of the volume of liquid dielectric fluid;
 a heat exchanger for cooling the dielectric fluid; and
 a liquid level measurement device comprising a load cell and a buoyancy element wherein the buoyancy element is configured to be partially submerged in the liquid phase and wherein the load cell and the buoyancy element are operably connected such that a change in liquid level (and/or volume based on geometry) may be determined.

2. The cooling system of embodiment 1 wherein the change in liquid volume is calculated from (1) a change in force measured by the load cell, (2) density of the buoyancy element, (3) cross-sectional area of the buoyancy element, (4) density of the fluid, (5) movement of the buoyancy element due to the change in force on the load cell, and (6) geometry of the liquid reservoir.

3. The cooling system of embodiment 1 wherein the buoyancy element is configured to hang substantially vertically from the load cell.

4. The cooling system of embodiment 1 further comprising a tank configured to comprise a volume of liquid dielectric fluid wherein the system is configured (1) to transfer liquid dielectric fluid from the tank to the vessel; or (2) to transfer dielectric fluid from the vessel to the tank; or (3) both (1) and (2) based on a change in liquid level (and/or volume based on geometry).

5. The cooling system of embodiment 1 further comprising an actuator configured to raise and lower the buoyancy element.

6. The cooling system of embodiment 1 further comprising a variable speed motor configured to raise and lower the buoyancy element.

7. The cooling system of embodiment 1 further comprising a housing which at least partially surrounds the load cell and the buoyancy element wherein said housing is configured to reduce disturbances.

8. The cooling system of embodiment 1, wherein the liquid level measurement device is located within the central reservoir.

9. The cooling system of embodiment 1, further comprising a housing which at least partially surrounds the load cell and the buoyancy element.

10. The cooling system of embodiment 9, further comprising an actuator configured to raise and/or lower the housing.

11. A cooling system for computing components comprising:
 a vessel configured to comprise a volume of liquid dielectric fluid;
 a central reservoir that is separated from a bath area of the vessel by a wall;
 a rack configured to hold one or more computer components such that the one or more computer components are configured to be at least partially submerged within the liquid dielectric fluid;
 a heat exchanger for cooling a liquid dielectric fluid; and
 a liquid level measurement device comprising:
  a load cell;
  a buoyancy element;
  a housing which at least partially surrounds the load cell and buoyancy element; and
  an actuator configured to raise and lower the housing;
 wherein the buoyancy element is configured to be partially submerged in a liquid and wherein the load cell and the buoyancy element are operably connected such that a change in liquid level (and/or volume based on geometry) may be determined.

12. The cooling system of embodiment 11 wherein the change in liquid volume is calculated from (1) a change in force measured by the load cell, (2) density of the buoyancy element, (3) cross-sectional area of the buoyancy element, (4) density of the liquid, (5) movement of the buoyancy element due to the change in force on the load cell, and (6) the geometry of the liquid reservoir.

13. The cooling system of embodiment 11 wherein the buoyancy element is configured to hang substantially vertically from the load cell.

14. The cooling system of embodiment 11 further comprising a variable speed motor configured to raise and lower the buoyancy element.

15. The cooling system of embodiment 11 wherein the liquid level measurement device is configured to measure an amount of dielectric liquid level change.

16. The cooling system of embodiment 11 which further comprises a processor configured to receive a force in the load cell, and calculate the change in liquid level (and/or volume based on geometry).

In the preceding specification, various embodiments have been described with references to the accompanying drawings. It will, however, be evident that various modifications and changes may be made thereto, and additional embodiments may be implemented, without departing from the broader scope of the invention as set forth in the claims that follow. The specification and drawings are accordingly to be regarded as an illustrative rather than restrictive sense.

We claim:

1. A cooling system for computing components comprising:
   a vessel configured to comprise a volume of liquid dielectric fluid;
   a central reservoir that is separated from a bath area of the vessel by a wall;
   a rack configured to hold one or more computer components such that the one or more computer components are configured to be at least partially submerged within the liquid dielectric fluid;
   a heat exchanger for cooling a liquid dielectric fluid; and
   a liquid level measurement device comprising:
   a load cell;
   a buoyancy element;
   a housing which at least partially surrounds the load cell and buoyancy element; and
   an variable speed motor configured to raise and lower the housing;
   wherein the buoyancy element is configured to be partially submerged in a liquid and wherein the load cell and the buoyancy element are operably connected such that a change in liquid level may be determined.

2. The cooling system of claim 1 further comprising a tank configured to comprise a volume of liquid dielectric fluid wherein the system is configured (1) to transfer liquid dielectric fluid from the tank to the vessel; or (2) to transfer dielectric fluid from the vessel to the tank; or (3) both (1) and (2) based on a change in liquid volume.

3. The cooling system of claim 1, wherein the liquid level measurement device is located within the central reservoir.

4. The cooling system of claim 1 wherein the change in liquid volume is calculated from (1) a change in force measured by the load cell, (2) density of the buoyancy element, (3) cross-sectional area of the buoyancy element, (4) density of the liquid, (5) movement of the buoyancy element due to the change in force on the load cell, and (6) the geometry of the liquid reservoir.

5. The cooling system of claim 1 wherein the buoyancy element is configured to hang substantially vertically from the load cell.

6. The cooling system of claim 1 wherein the liquid level measurement device is configured to measure an amount of dielectric liquid level change.

7. The cooling system of claim 1 which further comprises a processor configured to receive a force in the load cell, and calculate the change in liquid volume.

8. The cooling system of claim 1, wherein the load cell comprises a strain gauge.

9. The cooling system of claim 1, further comprising a housing which at least partially surrounds the load cell and the buoyancy element and wherein the load cell comprises a strain gauge.

* * * * *